US007859116B1

(12) United States Patent
Kelly et al.

(10) Patent No.: US 7,859,116 B1
(45) Date of Patent: Dec. 28, 2010

(54) EXPOSED METAL BEZEL FOR USE IN SENSOR DEVICES AND METHOD THEREFOR

(75) Inventors: Michael G. Kelly, Phoenix, AZ (US); Christopher J. Berry, Chandler, AZ (US); Christopher M. Scanlan, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 846 days.

(21) Appl. No.: 11/616,069

(22) Filed: Dec. 26, 2006

(51) Int. Cl.
*H01L 23/48* (2006.01)
(52) U.S. Cl. .............. 257/776; 257/433; 257/E33.059
(58) Field of Classification Search .............. 257/776, 257/778–780, E33.059, 432, 433, 434; 250/208.1, 250/214 R, 214.1; 348/246, 294
See application file for complete search history.

(56) References Cited

U.S. PATENT DOCUMENTS

| 7,230,309 | B2 * | 6/2007 | Bauer et al. ............. 257/433 |
| 2003/0215116 | A1 | 11/2003 | Brandt et al. |
| 2004/0154405 | A1 | 8/2004 | Ganapathi et al. |
| 2005/0030724 | A1 | 2/2005 | Ryhanen et al. |
| 2005/0031174 | A1 | 2/2005 | Ryhanen et al. |
| 2005/0069178 | A1 | 3/2005 | Nysaether et al. |
| 2005/0231215 | A1 | 10/2005 | Gozzini |
| 2005/0231216 | A1 | 10/2005 | Gozzini |
| 2005/0281441 | A1 | 12/2005 | Martinsen et al. |
| 2006/0050935 | A1 | 3/2006 | Bustgens et al. |

* cited by examiner

*Primary Examiner*—Matthew C Landau
*Assistant Examiner*—Hoa B Trinh
(74) *Attorney, Agent, or Firm*—Weiss & Moy, P.C.

(57) ABSTRACT

A sensor package has a substrate. A sensor die having an inactive surface is bonded to the substrate. An active surface of the sensor die is exposed. A portion of the active surface of the sensor die has an active imaging area. A metal bezel is formed on the active surface of the sensor die and separate from the imaging area.

20 Claims, 11 Drawing Sheets

US 7,859,116 B1

EXPOSED METAL BEZEL FOR USE IN SENSOR DEVICES AND METHOD THEREFOR

FIELD OF THE INVENTION

This invention relates to a sensor devices and, more specifically, to a metallized bezel which is added to a sensor device to enhance the functionality of the sensor device and a method therefor.

BACKGROUND OF THE INVENTION

Biometric sensing devices are commonly being used for personal identification. Biometric devices have been employed for security in order to limit use of devices such as laptop computers, cellular phones; preventing credit card and calling card fraud; limiting access to security areas, computers, and information; and ensuring security for electronic commerce.

A fingerprint sensor is one of the more widely used biometric sensing devices. The fingerprint sensor takes an electrical simulation of a fingerprint. The electrical simulation of the fingerprint is then scanned to detect ridges and valleys which are unique for each fingerprint. Complex algorithms analyze the data to identify characteristics of the fingerprint and to compare the data to stored data. If certain characteristics of the scanned data match the stored data, the fingerprint is considered a match.

In certain prior art fingerprint sensors, a metallic bezel is positioned around the sensor circuit which is used to scan the fingerprint. The metallic bezel is used to absorb electrostatic discharge and further to help determine the authenticity of the finger being placed on the fingerprint sensor. The metallic bezel surface is manually placed and attached to a substrate of a package containing the fingerprint sensor. This process is very labor intensive and time consuming. Furthermore, the metallic bezel tends to be rather bulky in size.

Therefore, a need exists to provide a device and method to overcome the above problem. The device and method will cost reduce and replace the functionality of the prior art metallic bezel on the fingerprint sensor and like devices.

SUMMARY OF THE INVENTION

A sensor package has a substrate. A sensor die having an inactive surface is bonded to the substrate. An active surface of the sensor die is exposed. A portion of the active surface of the sensor die has an active imaging area. A metal bezel is formed on the active surface of the sensor die and separate from the imaging area.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
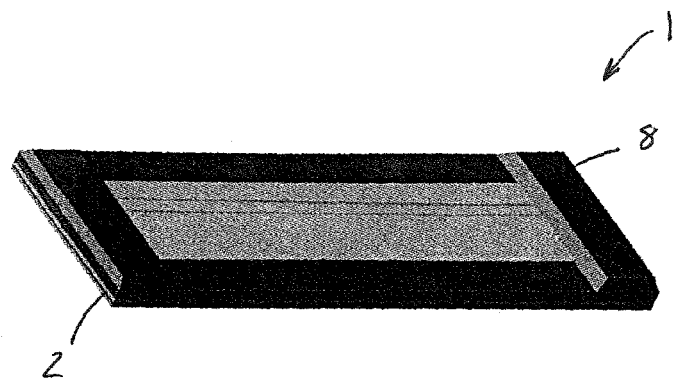
FIG. 1A is an elevated perspective view of a sensor device showing a metal bezel of the present invention.
Figure 1B:
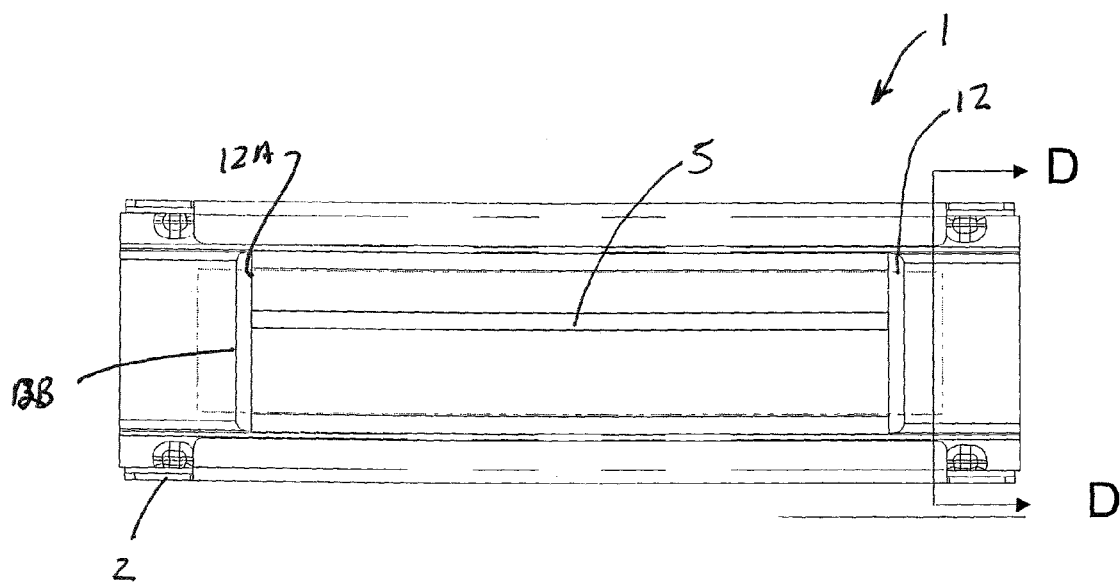
FIG. 1B is a top view of the sensor device of FIG. 1A.
Figure 1C:
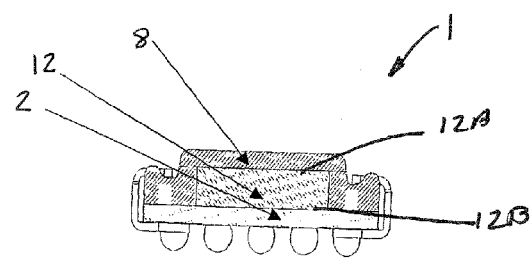
FIG. 1C is a cross-sectional view taken along lines D-D in FIG. 1B.
Figure 1D:
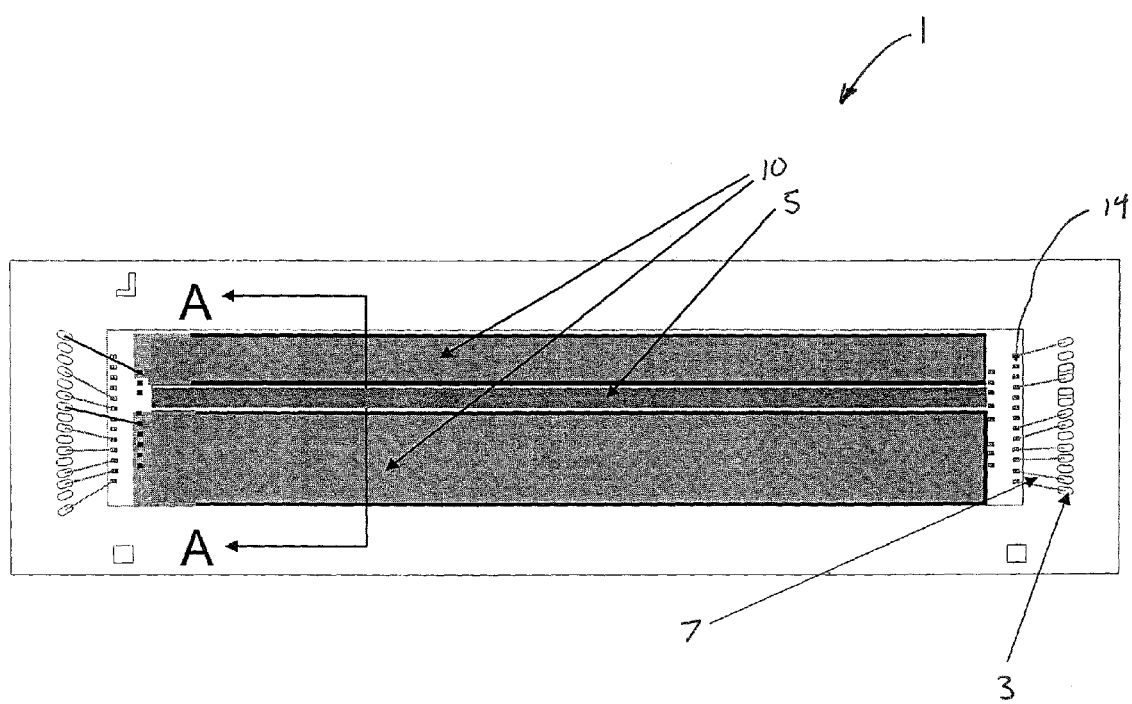
FIG. 1D is a top view of the sensor device showing substrate, sensor die, and wirebonds.
Figure 1E:
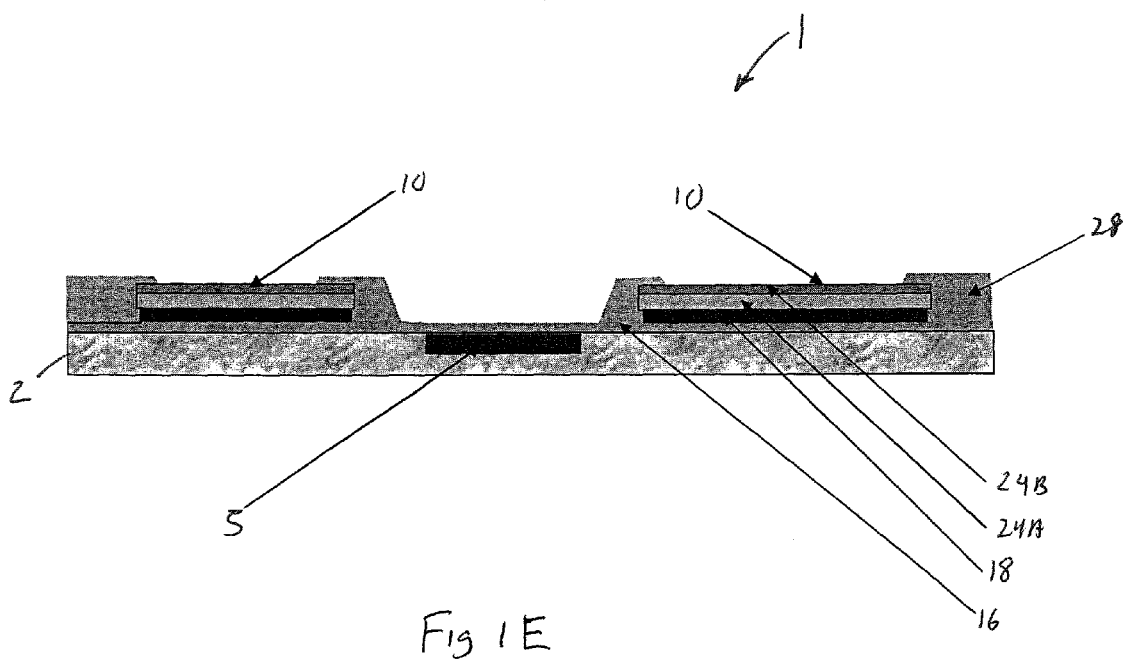
FIG. 1E is a cross-sectional view taken along lines A-A of FIG. 1D.

Referring to FIGS. 1A-1E, a sensor package 1 is shown. The sensor device 1 has a substrate 2. The substrate 2 has a plurality of bond pads 3 formed on the outer perimeter of the substrate 2. A sensor die 12 is provided having an active 12A and inactive 12B surfaces. The active surface 12A has an active pixel area 5. The inactive surface 12B is bonded to the substrate 2. The sensor die 12 is further electrically coupled to the substrate 2. In accordance with one embodiment, the sensor die 12 has a plurality of bond pads 14. The bond pads 14 are formed on the outer perimeter of the sensor die 12. Wirebonds 7 are used to couple the bond pads 14 of the sensor die 12 to the bond pads 3 of the substrate 2. An encapsulant 8 is placed over the wirebonds 7 to protect the wirebonds 7 from damage.

Other methods may be used to electrically couple the sensor die 12 to the substrate without departing from the spirit and scope of the present invention. For example, vias may be formed in the substrate 2 to electrically couple the sensor die 12 to electrical traces in the substrate.

A metal bezel 10 (hereinafter bezel 10) is formed on the sensor die 12. The bezel 10 is formed on a portion of the sensor die 12 that does not have active pixels. Thus, the active pixel area 5 and a passivation layer 16 are exposed and a protective layer 28 is exposed. The bezel 10 will provide enhanced functionality to the sensor die 12. The bezel 10 will allow the sensor die 12 to detect and scan a fingerprint of a user while replacing the functionality of the metallic bezel surface of the prior art. The bezel 10 will allow the sensor package 1 incorporating the sensor die 12 to have a smaller form factor while reducing cost.

Referring to FIGS. 1E-13, one method of forming the bezel 10 will be disclosed. While the method will be discussed in relation to a sensor die 12, it should be understood that the process is generally conducted on a wafer comprising a plurality of sensor die 12.

Figure 2:
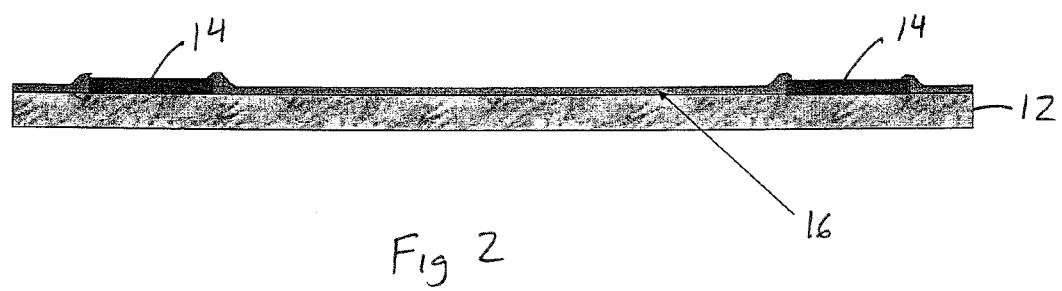
FIG. 2 is a cross-sectional view depicting a sensor device having wirebond pads and a passivation layer.

As shown in FIG. 2, a cross-section view of the sensor die 12 is shown. As stated above, the sensor die 12 will have bond pads 14 formed on a surface of the sensor die 12. The bond pads 14 are used to electrically couple the sensor die 12 to the substrate 2 in the sensor package 1. The sensor die 12 generally comes with a wafer coating material 16. In general, the top surfaces of the bond pads 14 are not covered with the wafer coating material 16. The wafer coating material 16 is generally a passivation material. The passivation material is used to protect against contamination and handling damage. In general, a material such as silicon nitride or the like is used for the coating layer 16. However, the listing of the above is given as examples and should not be seen as to limit the scope of the present invention.

Figure 3:
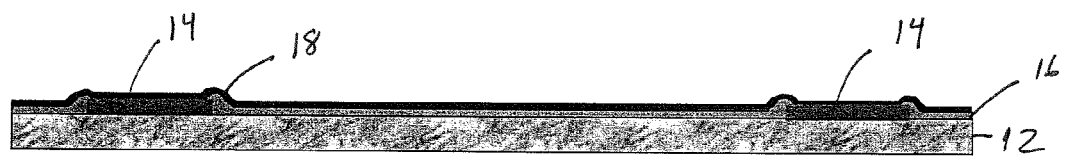
FIG. 3 is a cross-sectional view showing a seed layer.

A seed layer 18 is applied across the entire wafer on top of the wafer coating material 16 as shown in FIG. 3. This includes coating the top surfaces of the bond pads 14. The seed layer 18 is generally used to carry plating current from the edge to the center to enable electrolytic plating. The seed layer 18 further provides adhesion between layers, namely adhesion between the passivation layer 16 and subsequent plating layers.

Figure 4A:
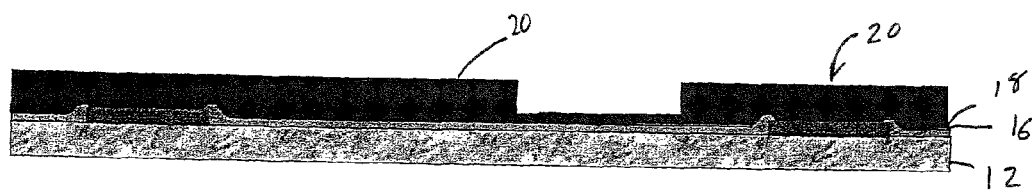
FIG. 4A is a cross-sectional view taken along lines A-A of FIG. 4 showing the pattern formed on the sensor device.
Figure 4:
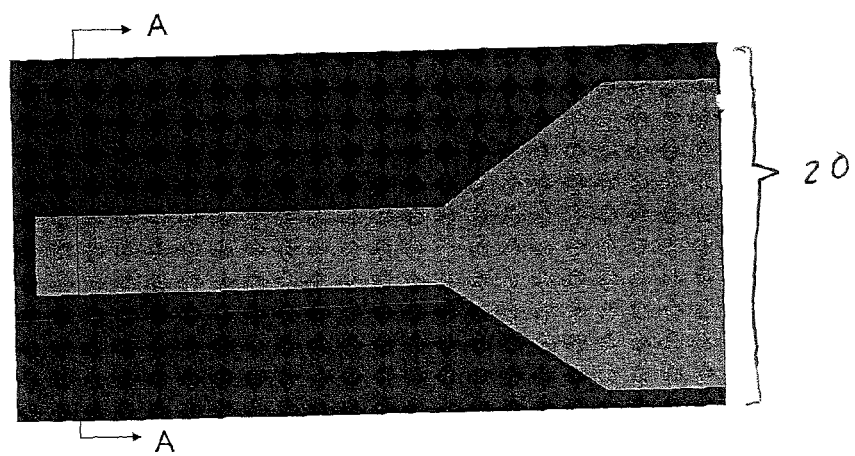
FIG. 4 a top view depicting a pattern formed on the seed layer.

Next, a photo imageable layer 20 is patterned on top of the seed layer 18 as shown in FIGS. 4 and 4A. In general, the photo imageable layer 20 is a material such as a photoresist used to form the template.

Figure 5:
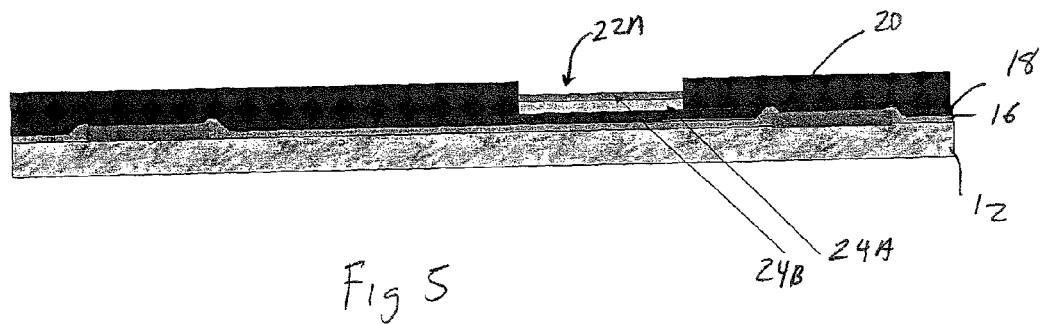
FIG. 5 is a cross-sectional view depicting a metal plating step.

Referring now to FIG. 5, one or more metal layers 24 are then formed in the patterned areas 22A formed in the photo imageable layer 20. In general, the wafer containing the sensor die 12 is placed in a plating bath to build up the metal layers 24. As shown in FIG. 5, a first metal layer 24A is formed in the patterned areas 22A. A second metal layer 24B is then formed on top of the first metal layer 24A. Different metals are used for each metal layer 24. In accordance with one embodiment of the present invention, the first metal layer 24A is formed of copper and the second metal layer 24B is formed of nickel. The above are given as examples and should not be seen as to limit the scope of the present invention.

Figure 6:
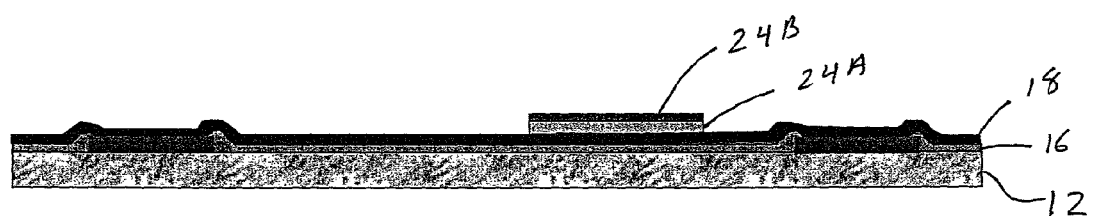
FIG. 6 is a cross-sectional view depicting the seed layer and the plated layer with the photo template layer removed.
Figure 7:
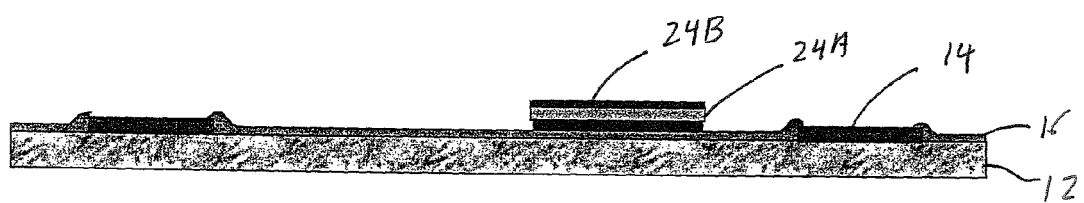
FIG. 7 is a cross-sectional view with the seed layer removed.

Referring now to FIG. 6, after the metal layers 24 are formed, the photoresist layer 20 is removed. Next, the seed layer 18 is removed as shown in FIG. 7. The seed layer 18 is generally removed by an etching process.

Figure 8A:
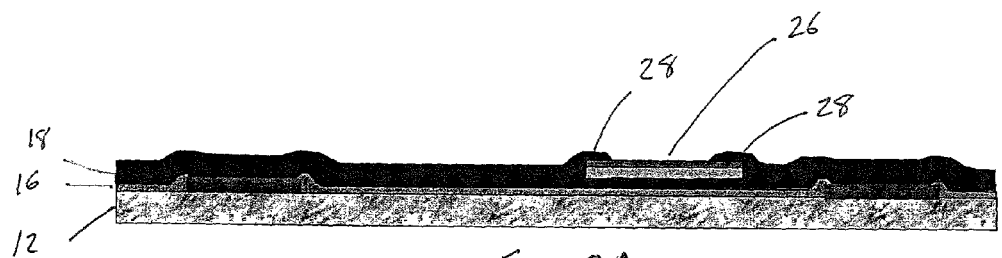
FIG. 8A is a cross-sectional view showing the wirebond pad formed on the patterned area and subsequently passivated.
Figure 8:
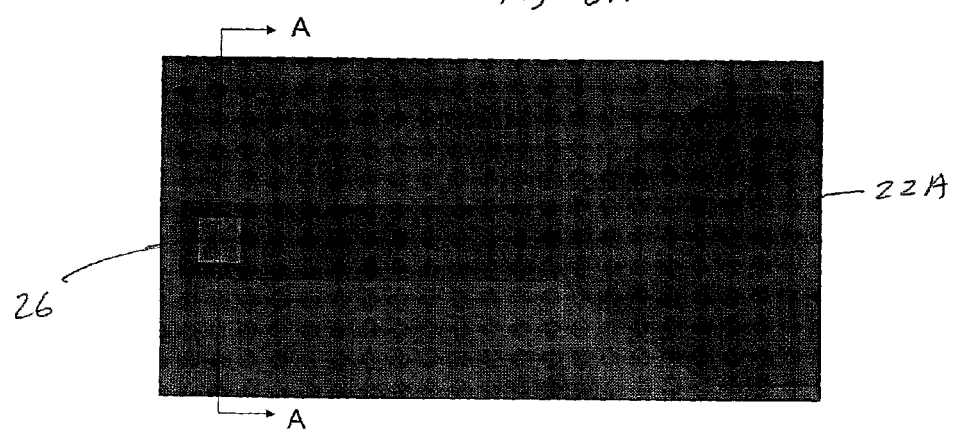
FIG. 8 is a top view of a wirebond pad formed on the patterned area.
Figure 9:
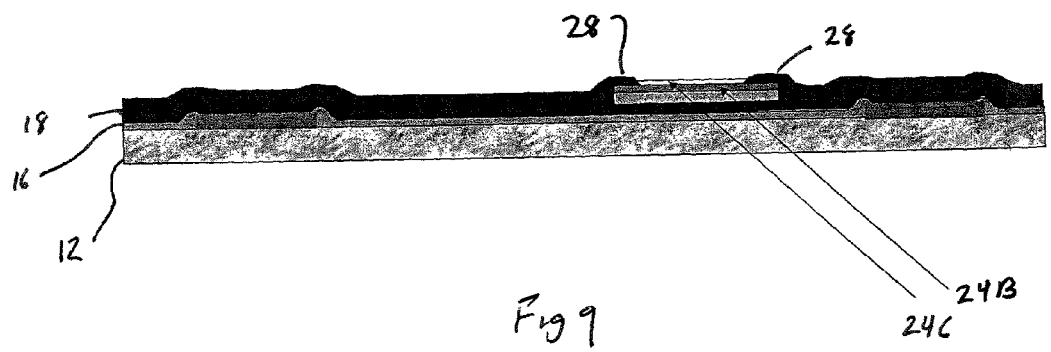
FIG. 9 is a cross-sectional view showing a metal layer forming a wirebondable cap.

Referring to FIGS. 8 and 8A, a wirebondable surface 26 may be formed on the metal layers 24. The wirebondable surface 26 is used for electrically connecting the bezel 10 to the substrate 2 of the sensor package 1. The wirebondable surface 26 may be formed in several different manners. As shown in FIG. 8A, the wirebondable surface 26 is formed by applying a second photoresist layer 28 on areas of the second metal layer 24B where the third metal layer 24C will not be applied. The wafer is then placed back into the plating bath to form the third metal layer 24C as shown in FIG. 9. In general, a metal such as gold or the like is used to form the wirebondable surface 26.

Figure 10:
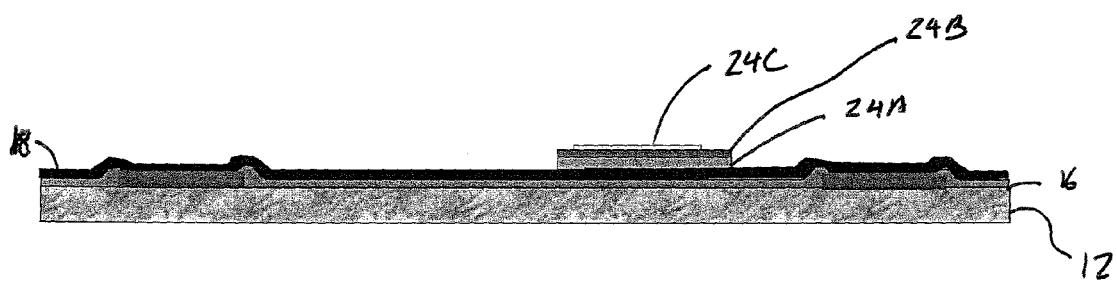
FIG. 10 is a cross-sectional view of the seed layer and the plated layer and a wirebondable cap with the photo template layer removed.
Figure 11:
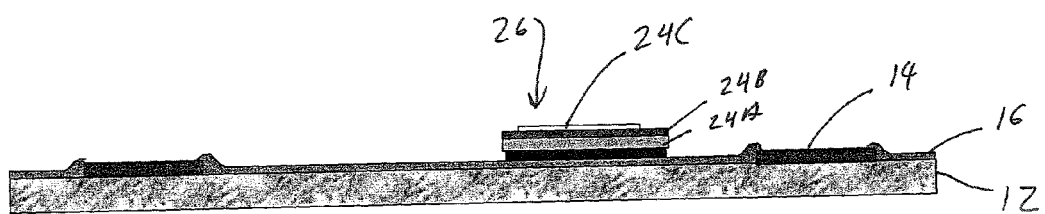
FIG. 11 is a cross-sectional view of the plated layer and a wirebondable cap with the photo template layer removed and seed layer removed.

Referring now to FIG. 10, after the third metal layer 24C is formed; the photoresist layer 28 is removed. Next, the seed layer 18 is removed as shown in FIG. 11. The seed layer 18 is generally removed by an etching process.

Figure 12:
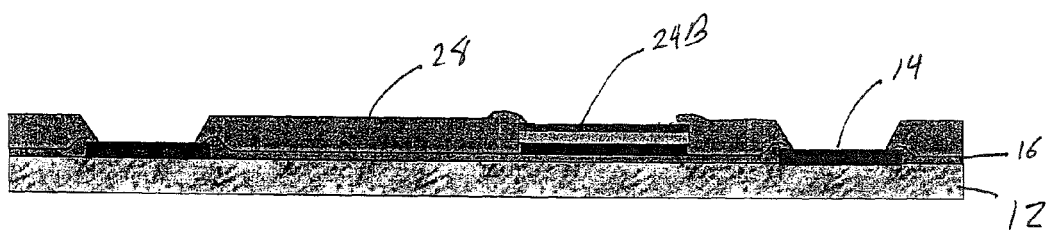
FIG. 12 is a cross-sectional view showing a protective layer on the sensor device.
Figure 13:
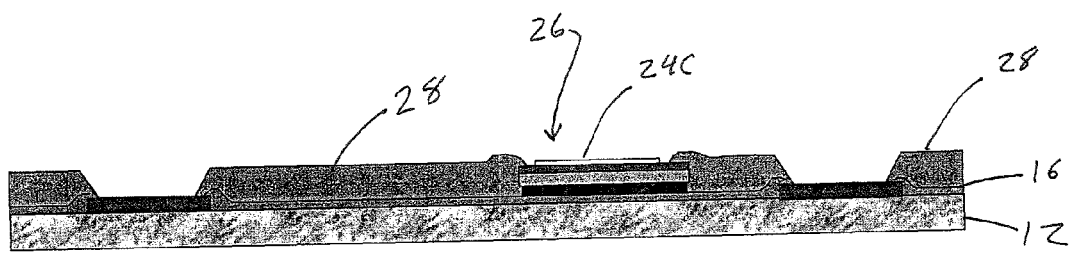
FIG. 13 is a cross-sectional view showing a protective layer on the sensor device when a wirebond pad is formed on the patterned area.

Referring now to FIGS. 12 and 13, a protective layer 28 is applied to the sensor die 12. The protective layer 28 is generally not applied on a top surface of the wirebond pads 14 or a top surface of the wirebondable surface 26 as shown in FIG. 13. The protective layer 28 is used to provide physical abrasion resistance. The protective layer 28 further seals the thin film metallization 10 from human residues such as moisture, salt, oil and the like. The protective layer 28 is generally formed of a polyimide or like material.

Figure 14:
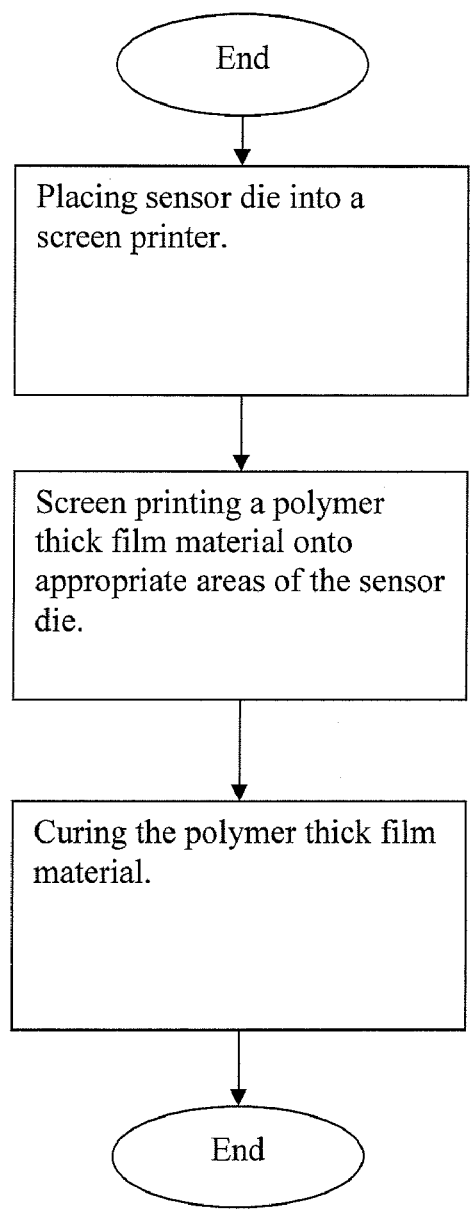
FIG. 14 is a flowchart showing another embodiment for forming the metal bezel.
Figure 15:
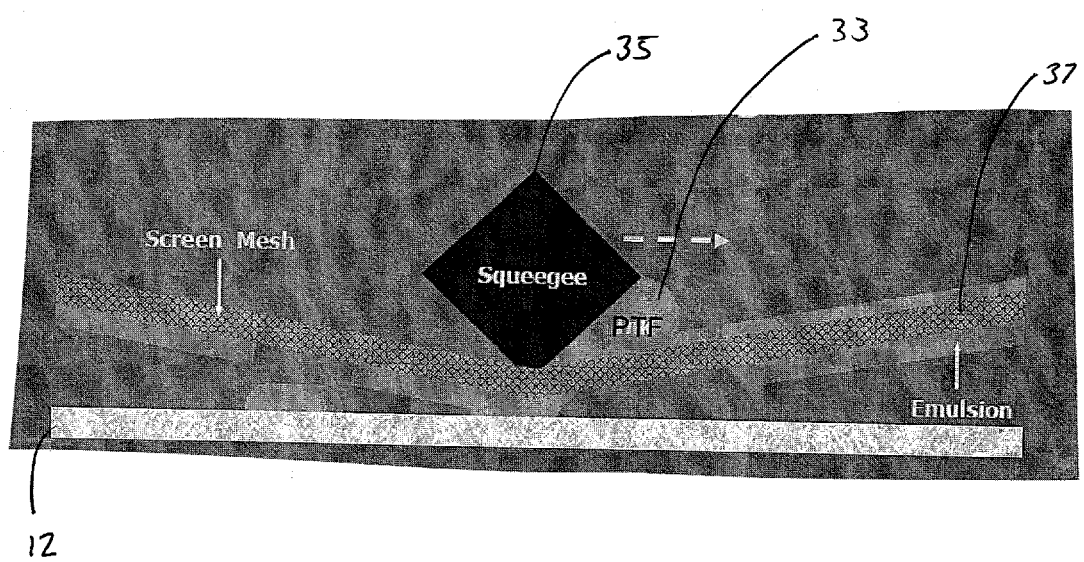
FIG. 15 is a cross-sectional view showing method for forming the metal bezel in accordance to the FIG. 14.

Referring to FIGS. 14-15, another embodiment for forming the bezel 10 is shown. In this embodiment, the bezel 10 is formed by placing the sensor die 12 into a screen printer. A polymer thick film material 33 is screen printed on appropriate areas of the sensor die 12. The polymer thick film material 33 consists of a screen-printed thick film conductive inks. A squeegee 35 will move the polymer thick film material 33 across and through a screen mesh 37. Emulsion and the screen mesh 37 define the printed pattern. The mesh count and the wire diameter of the screen mesh 37 and emulsion will all affect how the polymer thick film material 33 will be deposited. In general, the polymer thick film material 33 is screen printed on the active surface 12A on a non-imaging area of the sensor die 12. The sensor die 12 is then cured in an oven to harden the polymer thick film material 33 and create an electrically conductive bezel 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A sensor package comprising:
   a substrate;
   a sensor die having an inactive surface bonded to the substrate and an active surface which is exposed, a portion of the active surface having an active imaging area;
   a metal bezel formed on the active surface of the sensor die and separate from the imaging area, wherein a portion of the metal bezel is exposed.

2. A sensor package in accordance with claim 1 further comprising a passivation layer formed on the active surface, wherein the passivation layer separates the active imaging area from the metal bezel.

3. A sensor package in accordance with claim 1 wherein the metal bezel comprises:
   a patterned area formed on the active surface on a non-imaging area of the sensor die;
   a plurality of metal layers formed in the patterned area; and
   a protective coating formed around the plurality of metal layers, a section of a top metal layer being exposed.

4. A sensor package in accordance with claim 1 further comprising a wirebond area formed on the metal bezel.

5. A sensor package in accordance with claim 4 wherein the wirebond area is formed of gold.

6. A sensor package in accordance with claim 3 wherein a top layer of the plurality of metal layers is nickel.

7. A sensor package in accordance with claim 3 wherein the protective coating is a polyimide.

8. A sensor package comprising:
   a substrate;
   a sensor die having an inactive surface bonded to the substrate and an active surface which is exposed, a portion of the active surface having an active imaging area;

means formed on the active surface of the sensor die and separate from the imaging area for absorbing electrostatic discharge, wherein a portion of the means for absorbing electrostatic discharge is exposed.

9. A sensor package in accordance with claim 8 further comprising means formed on the active surface of the sensor die for separating the active imaging area from the means for absorbing electrostatic discharge.

10. A sensor package in accordance with claim 8 wherein the absorbing means comprises:
   a patterned area formed on the active surface on a non-imaging area of the sensor die;
   a plurality of metal layers formed in the patterned area; and
   means formed around the plurality of metal layers for protecting, a section of a top metal layer being exposed.

11. A sensor package in accordance with claim 10 further comprising a wirebond area formed on the absorbing means.

12. A sensor package in accordance with claim 11 wherein the wirebond area is formed of gold.

13. A sensor package in accordance with claim 10 wherein a top layer of the plurality of metal layers is nickel.

14. A sensor package in accordance with claim 10 wherein the protecting means is a polyimide.

15. A sensor package comprising:
   a substrate;
   a sensor die having an inactive surface bonded to the substrate and an active surface which is exposed, a portion of the active surface having an active imaging area; and
   a metal bezel formed on a portion of the active surface having inactive pixels, a section of the metal bezel being exposed.

16. A sensor package in accordance with claim 15 further comprising a passivation layer formed on the active surface, wherein the passivation layer separates the active imaging area from the metal bezel.

17. A sensor package in accordance with claim 15 wherein the metal bezel comprises:
   a patterned area formed on a portion of the active surface of the sensor die having inactive pixels;
   a plurality of metal layers formed in the patterned area; and
   a protective coating formed around the plurality of metal layers, a section of a top metal layer being exposed.

18. A sensor package in accordance with claim 15 further comprising a wirebond area formed on the metal bezel.

19. A sensor package in accordance with claim 15 further comprising:
   a first set of bond pads formed on an outer perimeter of the sensor die;
   a second set of bond pads formed on an outer perimeter of the substrate; and
   wirebonds coupled to the first set of bond pads and to the second set of bond pads.

20. A sensor package in accordance with claim 15 further comprising an encapsulant placed over the wirebonds.

* * * * *